United States Patent
Smith

(10) Patent No.: US 8,582,006 B2
(45) Date of Patent: Nov. 12, 2013

(54) PIXEL ARRANGEMENT FOR EXTENDED DYNAMIC RANGE IMAGING

(75) Inventor: Scott T. Smith, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 243 days.

(21) Appl. No.: 13/111,150

(22) Filed: May 19, 2011

(65) Prior Publication Data

US 2012/0188400 A1     Jul. 26, 2012

Related U.S. Application Data

(60) Provisional application No. 61/435,137, filed on Jan. 21, 2011.

(51) Int. Cl.
    *H04N 3/14*         (2006.01)
    *H04N 5/335*       (2011.01)
    *H04N 9/04*         (2006.01)
    *H04N 5/235*       (2006.01)
    *H04N 9/73*         (2006.01)

(52) U.S. Cl.
    USPC .................... 348/273; 348/229.1; 348/223.1

(58) Field of Classification Search
    USPC ............ 348/223.1, 272–273, 277, 289, 229.1
    See application file for complete search history.

(56) References Cited

U.S. PATENT DOCUMENTS

| | | | |
|---|---|---|---|
| 7,407,830 B2 | 8/2008 | Hong | |
| 7,714,915 B2 * | 5/2010 | Endo et al. | 348/272 |
| 2005/0212940 A1 * | 9/2005 | Kobayashi | 348/316 |
| 2009/0160981 A1 * | 6/2009 | Baumgartner et al. | 348/274 |
| 2011/0317048 A1 * | 12/2011 | Bai et al. | 348/294 |

\* cited by examiner

*Primary Examiner* — Kelly L Jerabek

(57) ABSTRACT

The present invention relates to an imager for improving image quality. The imager includes a pixel array of a plurality of pixels arranged in rows and columns. The imager also includes a color filter array (CFA) including a color pattern of a first color filter allowing a first pixel to detect a first color of light, and a second color filter allowing a second pixel to detect a second color of light and a third color of light. Each of the color filters in the color pattern are included in each row of the pixel array.

20 Claims, 15 Drawing Sheets

US 8,582,006 B2

PIXEL ARRANGEMENT FOR EXTENDED DYNAMIC RANGE IMAGING

CROSS REFERENCE TO RELATED APPLICATIONS

This application claims priority of U.S. Provisional Patent Application Ser. No. 61/435,137, filed Jan. 21, 2011, which is incorporated herein by reference.

FIELD

The present invention relates, in general, to an imager device including an array of pixels for performing extended dynamic range imaging. The pixels (i.e a combination of stacked and un-stacked pixels) in the imager are arranged in a color pattern to allow interlaced exposures alternating every row (e.g. a first exposure in odd rows and a second exposure in even rows).

BACKGROUND

In conventional imagers, extending dynamic range may be performed by interlaced exposures alternating every row pair (e.g. a long exposure and a short exposure). These conventional imagers typically implement a color filter array (CFA) such as a Bayer pattern where every other row filters different colors (i.e. odd rows filter green and red colors, whereas even rows filter blue and green colors). Thus, each exposure alternates every row pair (i.e. two rows are used and then two rows are skipped in a repeating pattern. Since two rows (i.e. a row pair) are skipped, aliasing artifacts and decreased resolution may result in the final image.

DETAILED DESCRIPTION

As will be described, the present invention provides an imager implementing a color pattern of stacked and un-stacked pixels. The pattern provides the ability to perform interlaced exposures for alternating rows. In general, odd rows may implement a short time exposure for a first field, and even rows may implement a long time exposure for a second field. The odd and an even images may then be interpolated and combined to produce a combined image with extended dynamic range.

Figure 1:
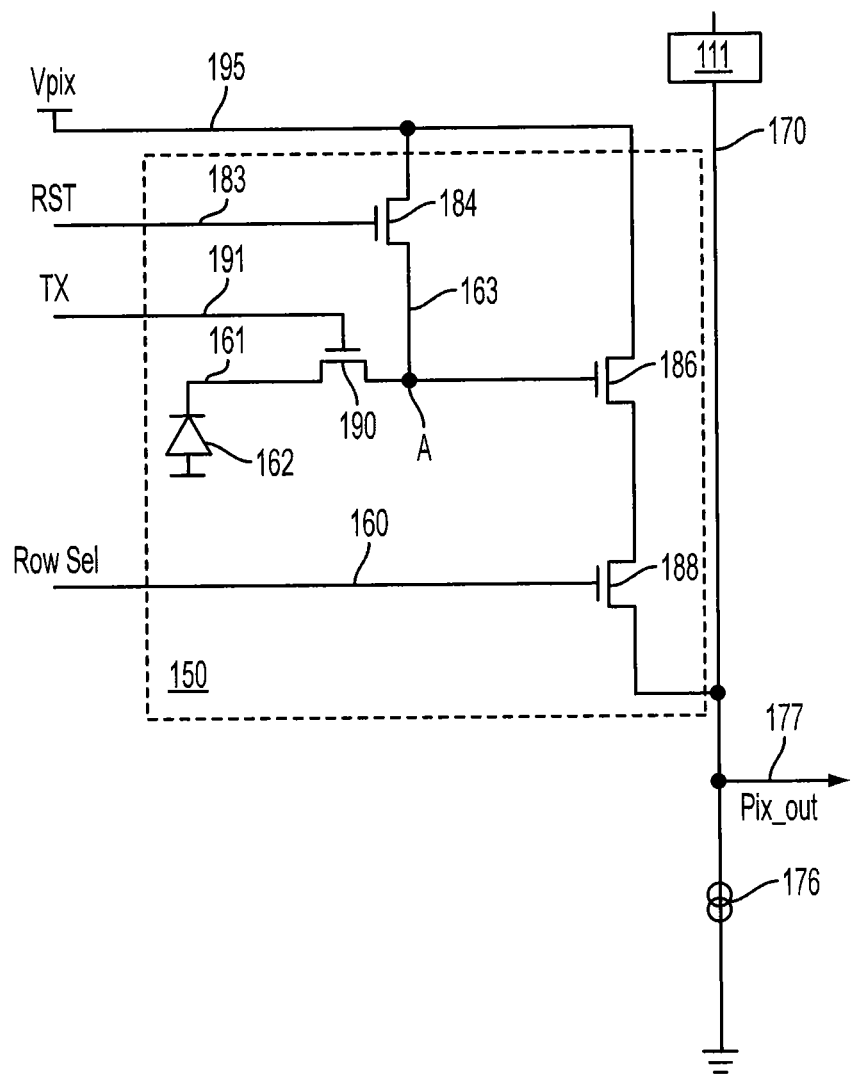
FIG. 1 is a view of a 4 transistor (4T) pixel architecture, according to prior art.

A conventional four transistor (4T) circuit for a pixel 150 of a CMOS imager is illustrated in FIG. 1. Pixel 150 is a 4T pixel, where 4T is commonly used in the art to designate use of four transistors to operate the pixel. The 4T pixel 150 has a photo-sensor such as a photodiode 162, a reset transistor 184, a transfer transistor 190, a source follower transistor 186, and a row select transistor 188. It should be understood that FIG. 1 shows the circuitry for operation of a single pixel 150, and that in practical use, there may be an M×N array of pixels arranged in rows and columns with the pixels of the array accessed using row and column select circuitry, as described in more detail below.

Photodiode 162 generates photo-electrons from incident photons and selectively passes the generated photo-electrons to a floating diffusion stage node A through transfer transistor 190 when activated by the TX control signal. The source follower transistor 186 has its gate terminal connected to node A and thus amplifies the signal appearing at floating diffusion node A. When a particular row containing pixel 150 is selected by an activated row select transistor 188, the signal amplified by the source follower transistor 186 is passed on a column line 170 to a column readout circuitry 242. The photodiode 162 accumulates a photo-generated charge in a doped region of the substrate. It should be understood that the pixel 150 may include a photogate or other photon to charge converting device, in lieu of a photodiode, as the initial accumulator for photo-generated charge.

The gate terminal of transfer transistor 190 is coupled to a transfer control signal line 191 for receiving the TX control signal, thereby serving to control the coupling of the photodiode 162 to node A. A voltage source Vpix is coupled through reset transistor 184 and conductive line 163 to node A. The gate terminal of reset transistor 184 is coupled to a reset control line 183 for receiving the RST control signal to control the reset operation in which the voltage source Vpix is connected to node A.

A row select signal (Row Sel) on a row select control line 160 is used to activate the row select transistor 180. Although not shown, the row select control line 160 is used to provide a row select signal to all of the pixels of the same row of the array, as are the RST and TX lines. Voltage source Vpix is coupled to transistors 184 and 186 by conductive line 195. A column line 170 is coupled to all of the pixels of the same column of the array and typically has a current sink 176 at its lower end. The upper part of column line 170, outside of the pixel array, includes a pull-up circuit 111 which is used to selectively keep the voltage on column line 170 high. Maintaining a positive voltage on the column line 170 during an image acquisition phase of a pixel 150 keeps the potential in a known state on the column line 170. Signals from the pixel 150 are therefore selectively coupled to a column readout circuit through the column line 170 and through a pixel output ("Pix_out") line 177 coupled between the column line 170 and the column readout circuit.

As known in the art, a value can be read from pixel 150 in a two step correlated double sampling process. Prior to a charge integration period, node A and node 161 are reset to a high potential by activating reset transistor 184 and transfer transistor 190. During the charge integration period, photodiode 162 produces a charge from incident light. This is also known as the image acquisition period. During the pixel sample and hold period, node A is reset to a high potential by activating reset transistor 184. The charge (i.e. reset signal) at node A after reset is readout to column line 170 via the source follower transistor 186 and row select transistor 188. Readout circuitry 242 in FIG. 2 then samples and holds the reset signal (SHR). Transfer transistor 190 is then activated, and the charge from photodiode 162 is passed to node A, where the charge is amplified by source follower transistor 186 and passed to column line 170 through row select transistor 188. Readout circuitry 242 then samples and holds the integrated charge signal (SHS). As a result, two different voltage signals (i.e. the SHR and SHS) are readout, sampled and held for further processing as known in the art. Typically, all pixels in a row are readout simultaneously onto respective column lines 170.

Figure 2:
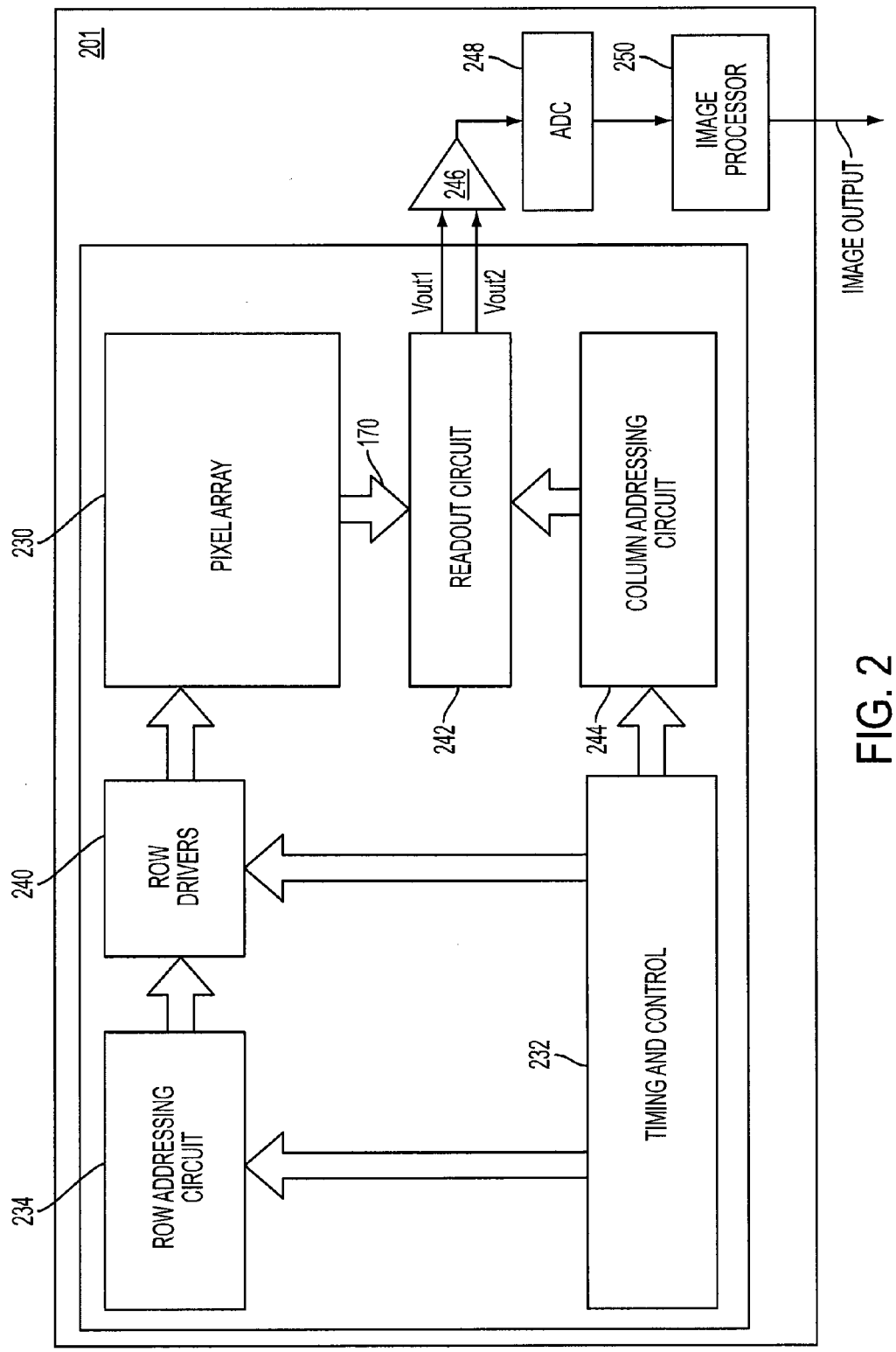
FIG. 2 is a view of a complimentary metal oxide semiconductor (CMOS) imager architecture, according to prior art.

FIG. 2 shows an example CMOS imager integrated circuit chip 201 that includes an array 230 of pixels and a controller 232, which provides timing and control signals to enable reading out of signals stored in the pixels in a manner commonly known to those skilled in the art. Exemplary arrays have dimensions of M×N pixels, with the size of the array 230 depending on a particular application. The pixel signals from the array 230 are readout a row at a time using a column parallel readout architecture. The controller 232 selects a particular row of pixels in the array 230 by controlling the operation of row addressing circuit 234, row drivers 240 and column addressing circuit 244. Signals corresponding to charges stored in the selected row of pixels and reset signals are provided on the column lines 170 to a column readout circuit 242 in the manner described above. The pixel signal read from each of the columns can be readout sequentially using a column addressing circuit 244. Pixel signals (Vrst, Vsig) corresponding to the readout reset signal and integrated charge signal are provided as respective outputs Vout1, Vout2 of the column readout circuit 242 where they are subtracted in differential amplifier 246, digitized by analog to digital converter 248, and sent to an image processor circuit 250 for image processing.

Figure 3A:
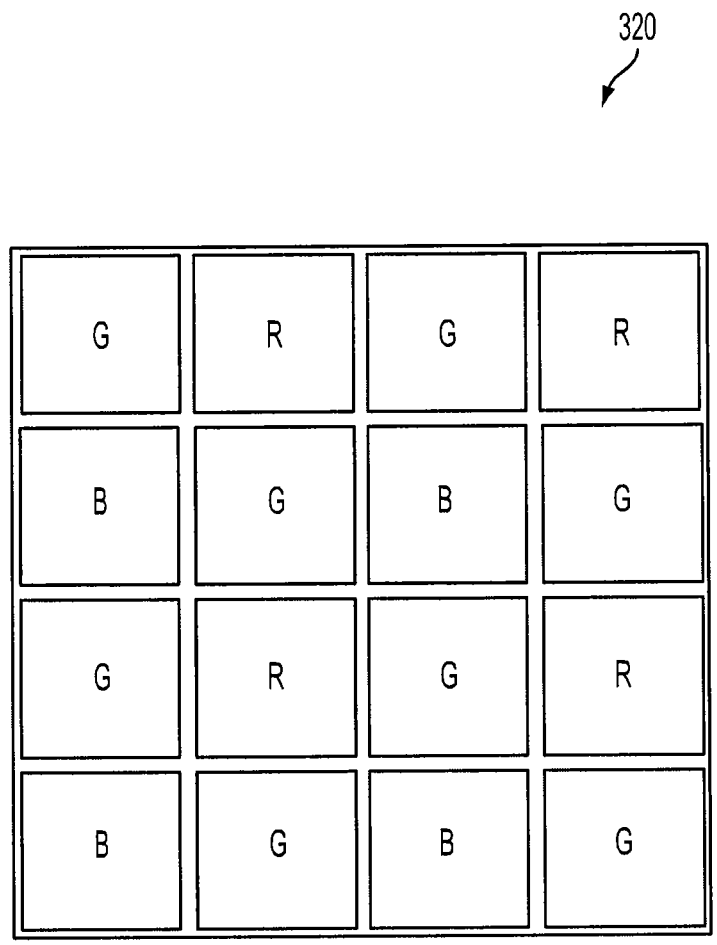
FIG. 3a is a view of a Bayer pattern color filter array (CFA), according to an embodiment of the present invention.
Figure 3B:
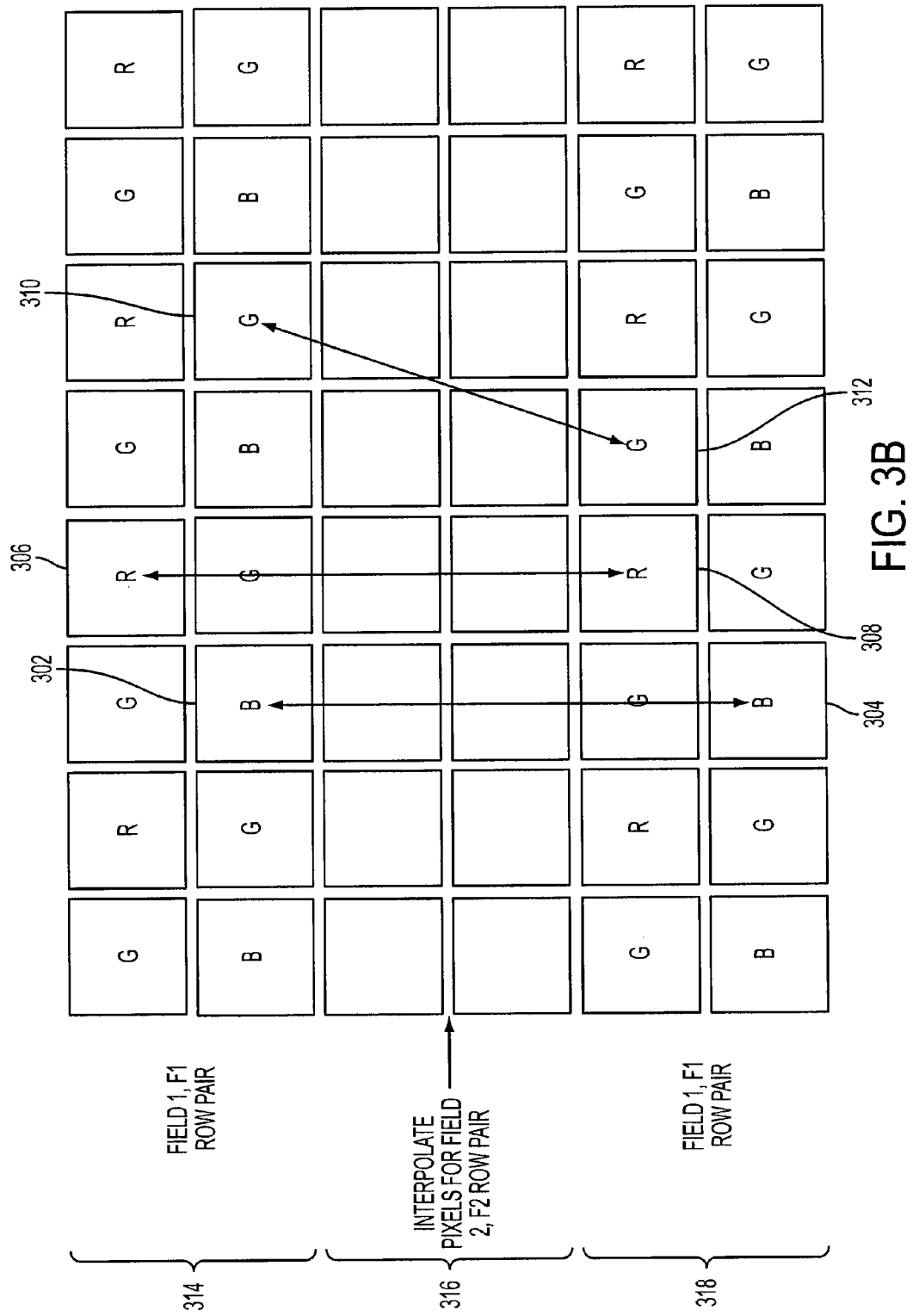
FIG. 3b is a view of an imager implementing a row pair dual exposure and interlaced readout, according to an embodiment of the present invention.

Shown in FIG. 3A is an imager 320 that implements a Bayer pattern CFA. Specifically, Bayer pattern CFA comprises alternating rows of green and red (G and R) color filters and blue and green (B and G) color filters. FIG. 3B shows a more detailed view of the imager implementing the conventional Bayer pattern CFA. More specifically, FIG. 3B shows that row pairs (i.e., every two rows) are separated into a different fields (F1, F2). For example, all of the odd row pairs may be configured into field F1, whereas all of the even row pairs may be configured into field F2. By configuring the imager array into two separate fields, two separate images with different exposure times may be captured.

In this implementation, each field produces a separate image (i.e., an odd image and an even image). Since the odd image (i.e., the F1 image) skips row pairs, interpolation must be performed to estimate the skipped pixel values. This is shown in FIG. 3B where two row pairs 314 and 318 for field F1 are exposed to produce an image. The pixels in skipped row pair 316 are interpolated based on the pixel values in the adjacent row pairs 314 and 318. For example, pixels 302 and 304, 306 and 308 and 310 and 312 may be combined to determine the pixel values in row pair 316 using interpolation methods (e.g. linear interpolation).

Figure 4A:
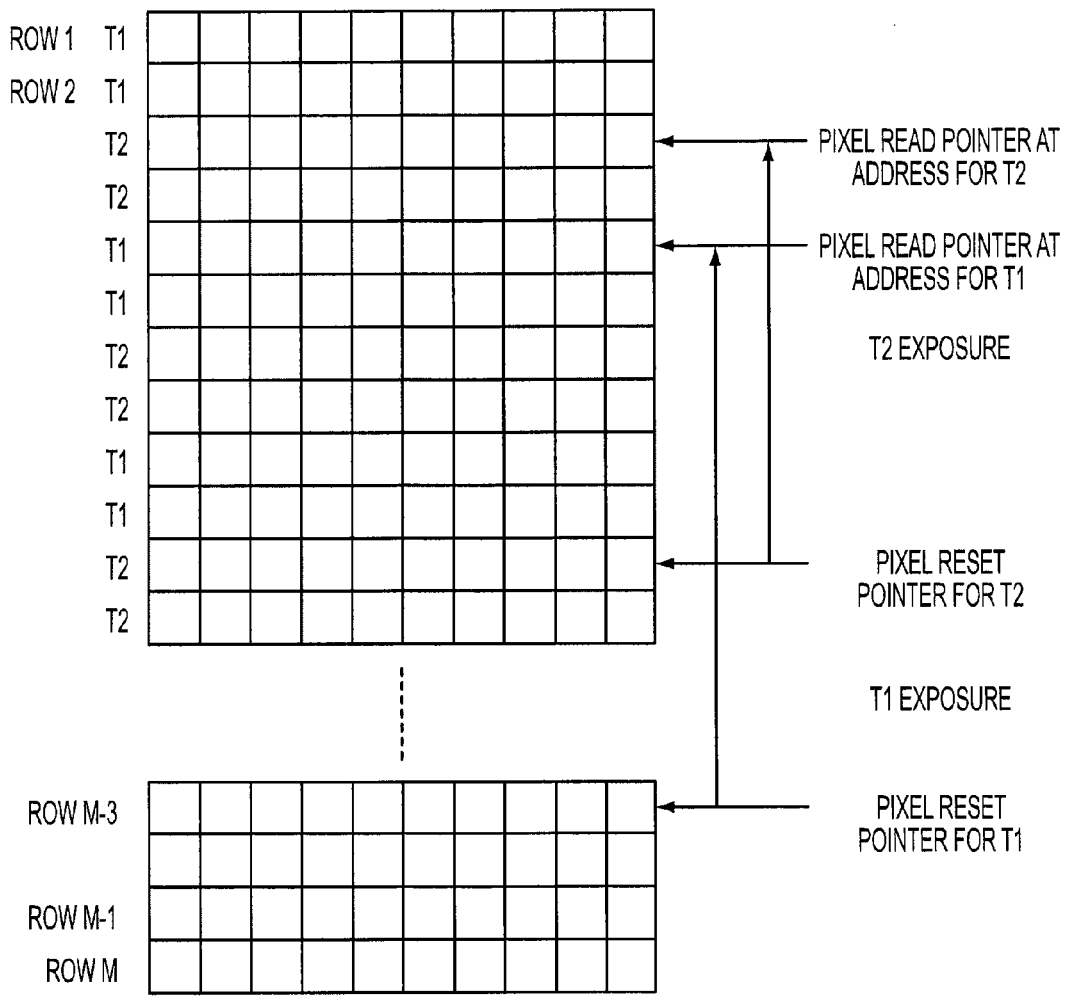
FIG. 4a is another view of the imager implementing the row pair dual exposure and interlaced readout, according to an embodiment of the present invention.

FIG. 4A shows a pixel array having row pairs alternating with exposure times T1 and T2 respectively (i.e., a long exposure field and a short exposure field). By operating the row pairs at different exposure times, bright image data and dark image data may be captured. For example, bright image data in a scene may be captured in field F2 using a short exposure T2, while dark image data in the scene may be captured in field F1 using a long exposure T1.

In a global shutter mode, odd row pairs would be controlled by an odd reset line, while even row pairs would be controlled by an even reset line. The odd row pairs (i.e., the T1 row pairs) may be reset and then start signal integration at time zero (i.e., the long exposure row pairs for the first field F1 may start exposure first). The even row pairs (i.e., the T2 row pairs) may then be reset and start signal integration at sometime thereafter. In one example, both exposure times T1 and T2 may expire simultaneously.

In a rolling shutter mode, each row pair would be controlled by a respective reset line. The rolling shutter mode is shown in FIG. 4a where the odd row pairs have a reset pointer and a read pointer separated by a number of row pairs to accommodate exposure time T1 (i.e. the time between reset and read is T1). Similarly, the even row pairs have a reset pointer and a read pointer separated by a number of row pairs to accommodate exposure time T2 (i.e. the time between reset and read is T2).

Figure 4B:
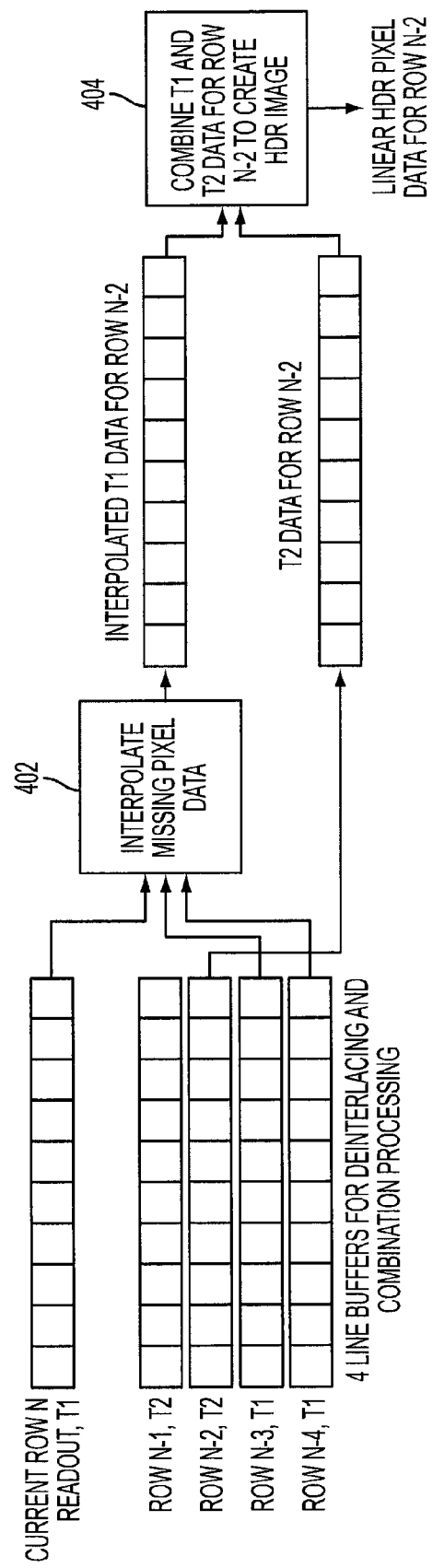
FIG. 4b is a detailed view of the interlaced readout for the imager implementing the row pair dual exposure, according to an embodiment of the present invention.

Since two rows (i.e., row pairs) are skipped, each field interpolates the skipped pixels in order to produce a full image. As shown in FIG. 4B, field F1 which relates to the T1 exposure time may utilize rows N, N−3 and N−4 to interpolate the pixels and skip row N−2. Interpolated row N−2 and the data from row N−2 in field F2 may then be combined (i.e., the interpolated long exposure data may be combined with the short exposure data) to create a high dynamic range (HDR) image. Row N−1, however, may not be accounted for and therefore vertical resolution may be reduced causing artifacts such aliasing.

In order to avoid the above described limitations, it is beneficial to arrange the Bayer patterns CFA such that each row is able to capture the green, red and blue light. By having each row being able to capture every color in the CFA, it will be shown that duel exposure and interlaced readout can be performed for alternating rows (not row pairs).

Figure 5A:
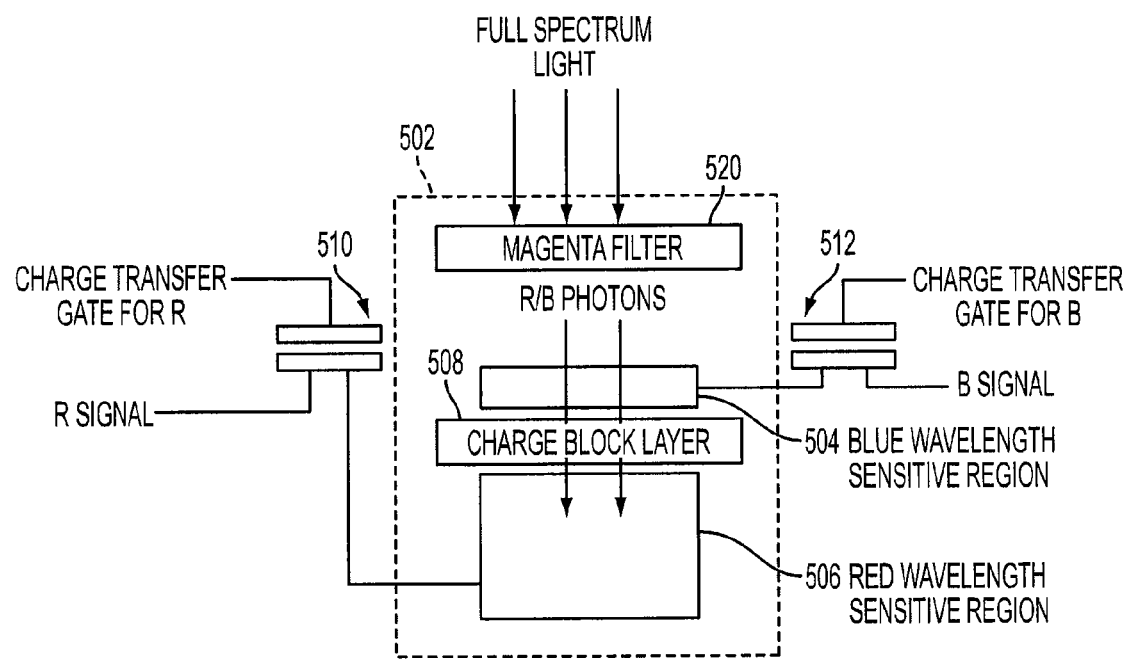
FIG. 5a is a view of a stacked red/blue (R/B) pixel, according to an embodiment of the present invention.

As shown in FIG. 5A, a stacked R/B pixel can be used to replace the R and B pixels of the CFA. By replacing the R with a stacked R/B and the B with a stacked R/B, each row of pixels effectively contains all color G, R and B pixel information. This allows interlaced exposures alternating every row compared to alternating every two rows in the case of the conventional Bayer pattern. In general, odd row pixels may form field F1 that have an exposure time T1 while even rows form field F2 that have an exposure time T2. It should be noted that this configuration is not limited to odd and even rows.

In general, stacked R/B pixel 502 includes a magenta filter 520 which allows both red and blue photons to impinge on the photosensitive regions. Specifically, a blue wavelength photo sensitive region 504 is stacked on top of a red wavelength photo sensitive region 506. These two regions are separated by a charge block layer 508. Each region is also coupled to a respective transfer gate. Thus, accumulated charge from region 506 is read out as an R signal via transfer gate 510, whereas charge accumulated from region 504 is read out as a B signal through transfer gate 512. In general, transfer gates 510 and 512 allow the R/B signal to be connected to the floating diffusion of a 4T pixel architecture.

In the stacked pixel, silicon is relatively more transparent to red light than to blue light. Thus, red photons travel more deeply into the pixel structure than blue photons (i.e. red photons reach region 506 but blue photons do not reach region 506). Both blue and red photons, however, may reach region 504 thereby contributing to charge in region 504. Thus, it may be desirable to subtract at least a portion of the R signal from the B signal to reduce the charge contribution of the red photons in region 504. In one embodiment, a subtraction (not shown) of R signal from the B signal may be performed after the pixel signals are digitized.

Figure 5B:
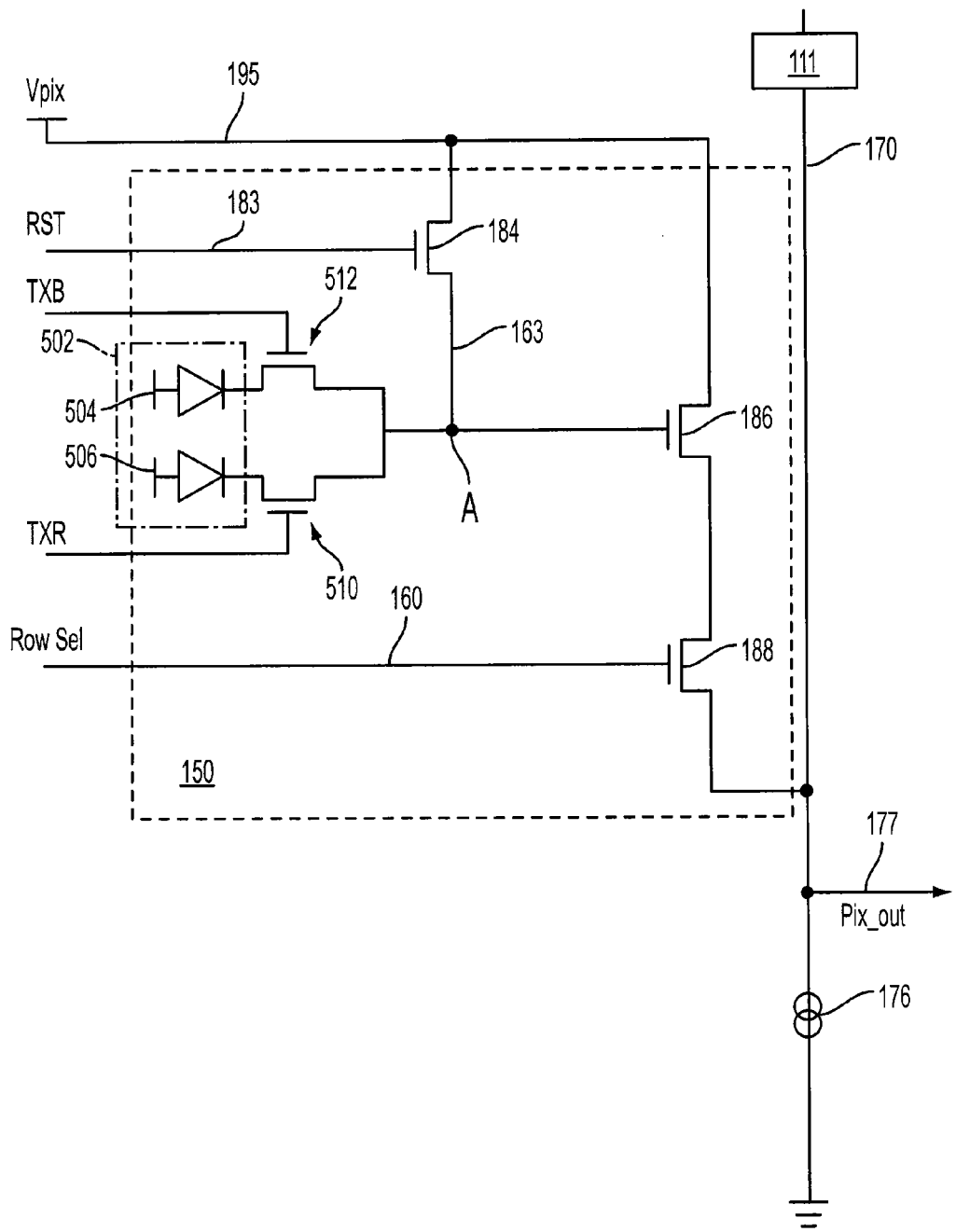
FIG. 5b is a view of a 4T pixel architecture with the stacked R/B pixel in FIG. 5a, according to an embodiment of the present invention.

The connection of stacked pixel 502 with the convention 4T pixel architecture is shown in FIG. 5B. Specifically, the two stacked photo diodes (i.e., blue photo diode 504 and red photo diode 506) may be accumulating blue and red light charge signals respectively during an integration period. The charge from the blue photo diode or the red photo diode may then be transferred to floating diffusion A via transfer gates 510 and 512, where it may then be translated to into a voltage onto column line 170.

Figure 6:
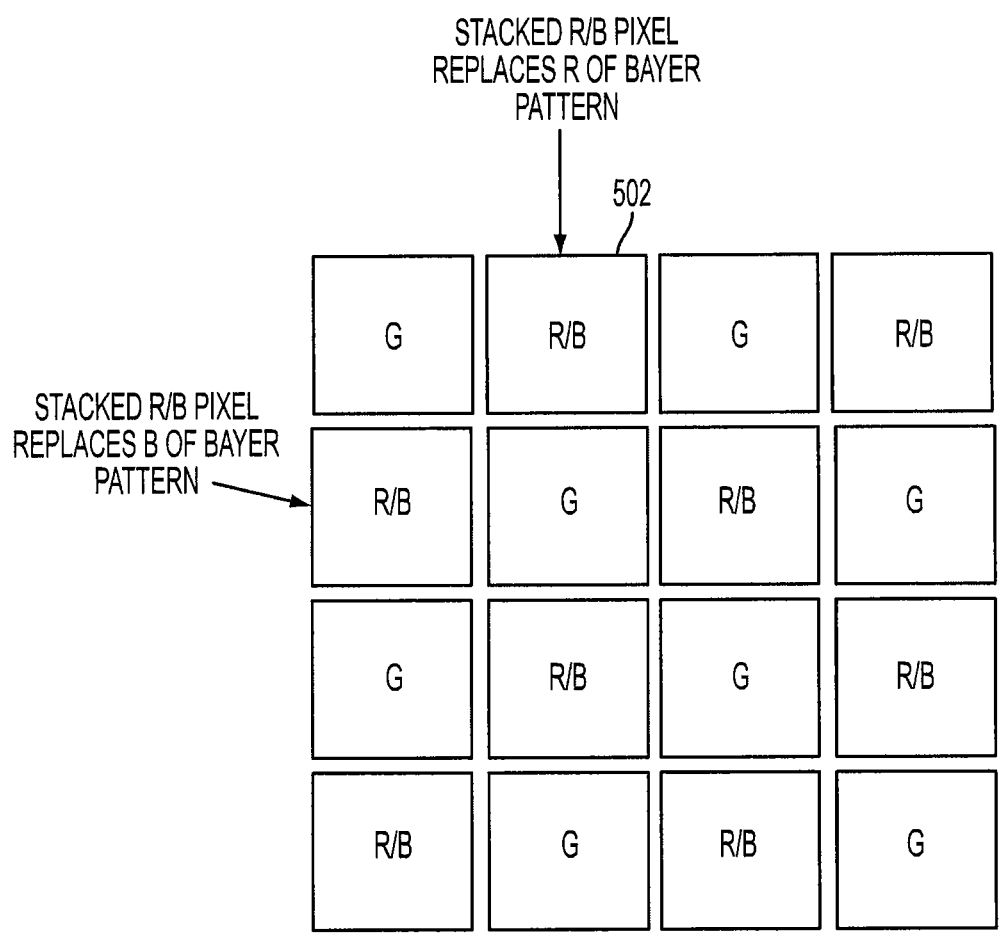
FIG. 6 is a view of a stacked CFA imager implementing stacked R/B pixels, according to an embodiment of the present invention.

The stacked Bayer pixel pattern CFA is shown in FIG. 6 where stacked RIB pixels 502 are configured amongst green pixels on each row. This general pattern is repeated throughout the pixel array so that each row may be able to collect light for the full Bayer pattern spectrum (for the green, red and the blue light). It should be noted that this configuration is not limited to a Bayer pattern and may be used for other CFAs (e.g. red, green, blue, yellow, magenta, cyan, RGBE, etc.).

Figure 7:
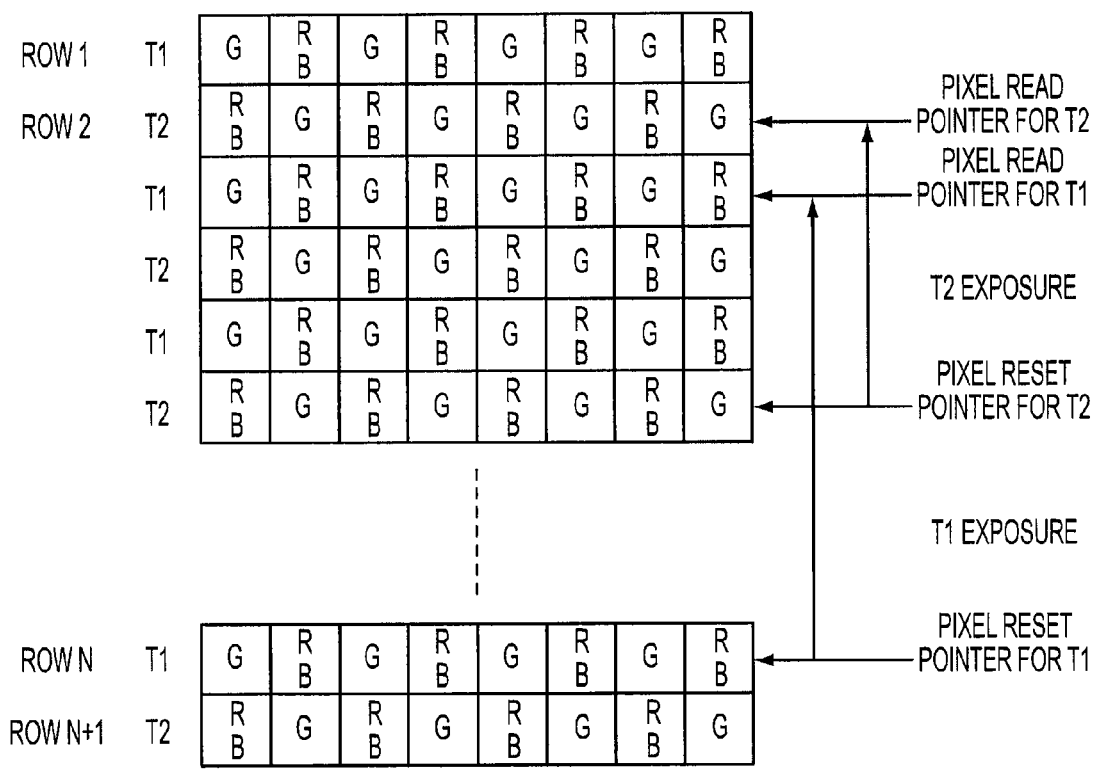
FIG. 7 is a view of the imager implementing row based dual exposure and row based interlaced readout, according to an embodiment of the present invention.

FIG. 7 is another view of the stacked Bayer pattern CFA imager for rows 1 through N+1. It is shown that since each row has green, red and blue pixels, that the fields can be broken into even and odd rows (not row pairs). Thus, the odd rows may be exposed for exposure period T1, whereas the even rows may be exposed for exposure period T2.

As previously described, in a global shutter mode, odd rows (not row pairs) may be controlled by an odd reset line, while even rows (not row pairs) may be controlled by an even reset line. The odd rows (i.e., the T1 row) may be reset and then start signal integration at time zero (i.e., the long exposure rows for the first field F1 may start exposure first). The even rows (i.e., the T2 rows) may then be reset and start signal integration at sometime thereafter. In one example, both exposure times T1 and T2 may expire simultaneously.

In a rolling shutter mode, each row may be controlled by a respective reset line. The rolling shutter mode is shown in FIG. 4a where the odd rows have a reset pointer and a read pointer separated by a number of rows to accommodate exposure time T1 (i.e. the time between reset and read is T1). Similarly, the even rows have a reset pointer and a read pointer separated by a number of rows to accommodate exposure time T2 (i.e. the time between reset and read is T2).

Figure 8:
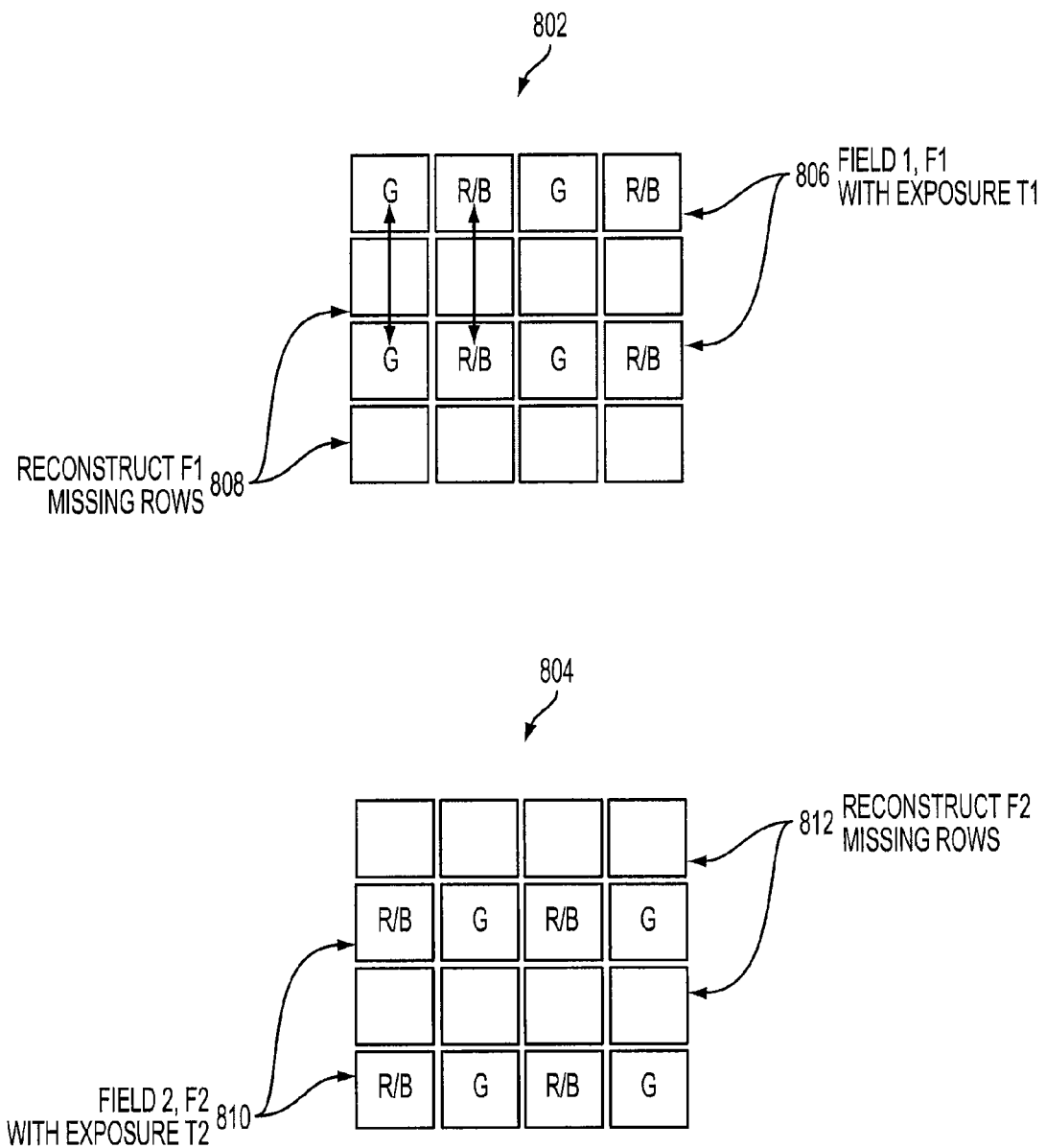
FIG. 8 is a drawing showing each field in the row based dual exposure, according to an embodiment of the present invention.

An example of two different fields is shown in FIG. 8 where field F1 802 skips the even rows and field F2 804 skips the odd rows. Thus, to produce a full image for field F1, the even rows are interpolated, whereas to produce a full image for F2, the odd rows are interpolated. By constructing two different fields F1 and F2, two separate images (i.e., an odd image corresponding to a long exposure time and an even image corresponding to a short exposure time) may be generated.

Figure 9:
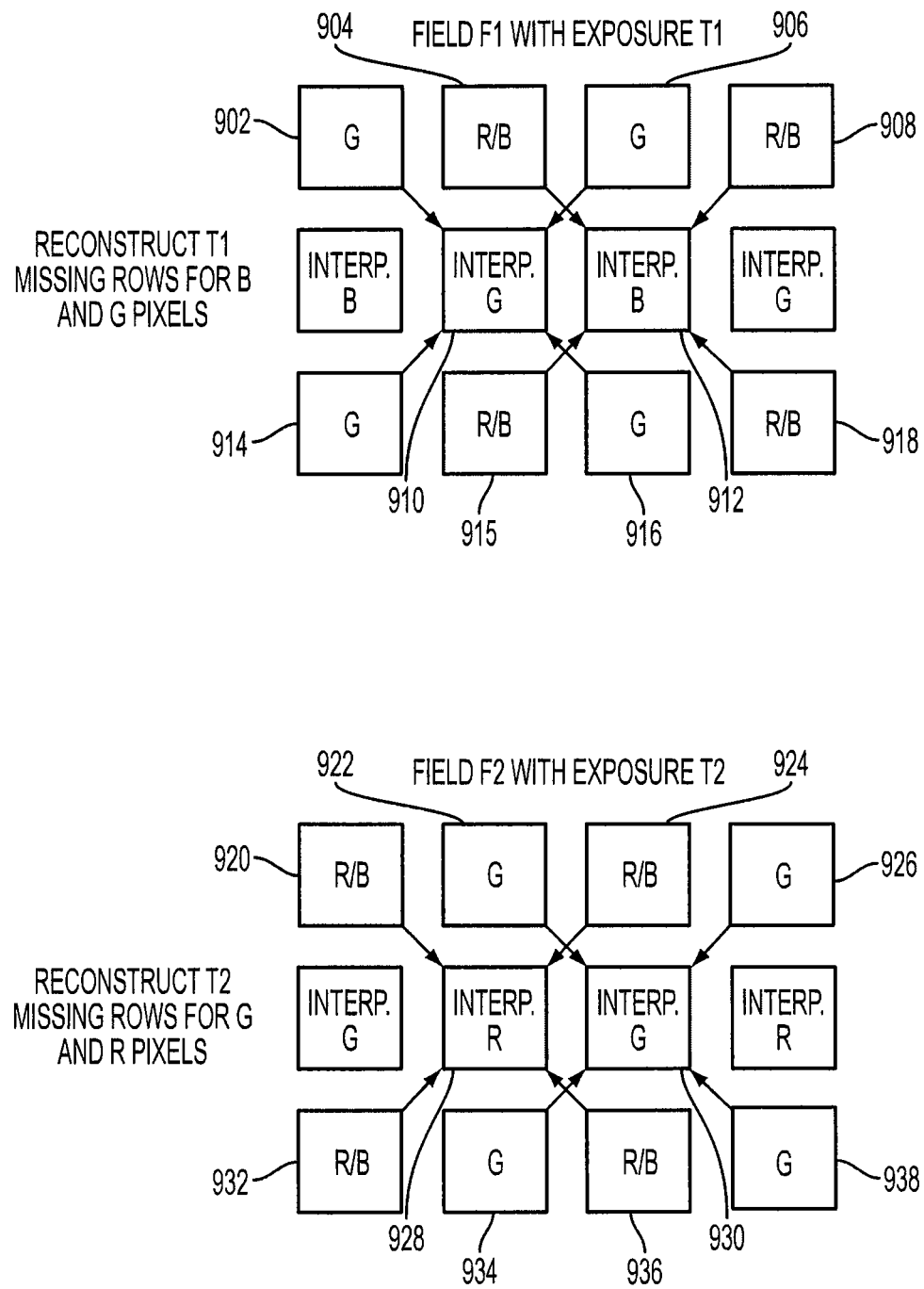
FIG. 9 is a drawing showing the interpolation of each field in the row based dual exposure, according to an embodiment of the present invention.

An example of the interpolation is at least shown in FIG. 9. Pixels 910 and 912 for field F1 may be interpolated based on pixels 902, 904, 906, 908, 914, 915, 916 and 918. Similarly, pixels 928 and 930 for field F2 may be interpolated based on pixels 920, 922, 924, 926, 932, 934, 936 and 938. For example, in field F1, pixel 912 should be a blue pixel. Thus, since stacked pixels 904, 908, 915 and 918 include blue pixel data, those values may be utilized to interpolate the blue pixel value 912. Similarly, in field F2 since pixel 928 is a red pixel, the red pixel data from stacked pixels 920, 924, 932 and 936 may be utilized to determine the red value of pixel 928. Thus, the imager is able to select either the red or the blue pixel data from the stacked pixel in order to perform interpolation for the skipped pixels.

Figure 10:
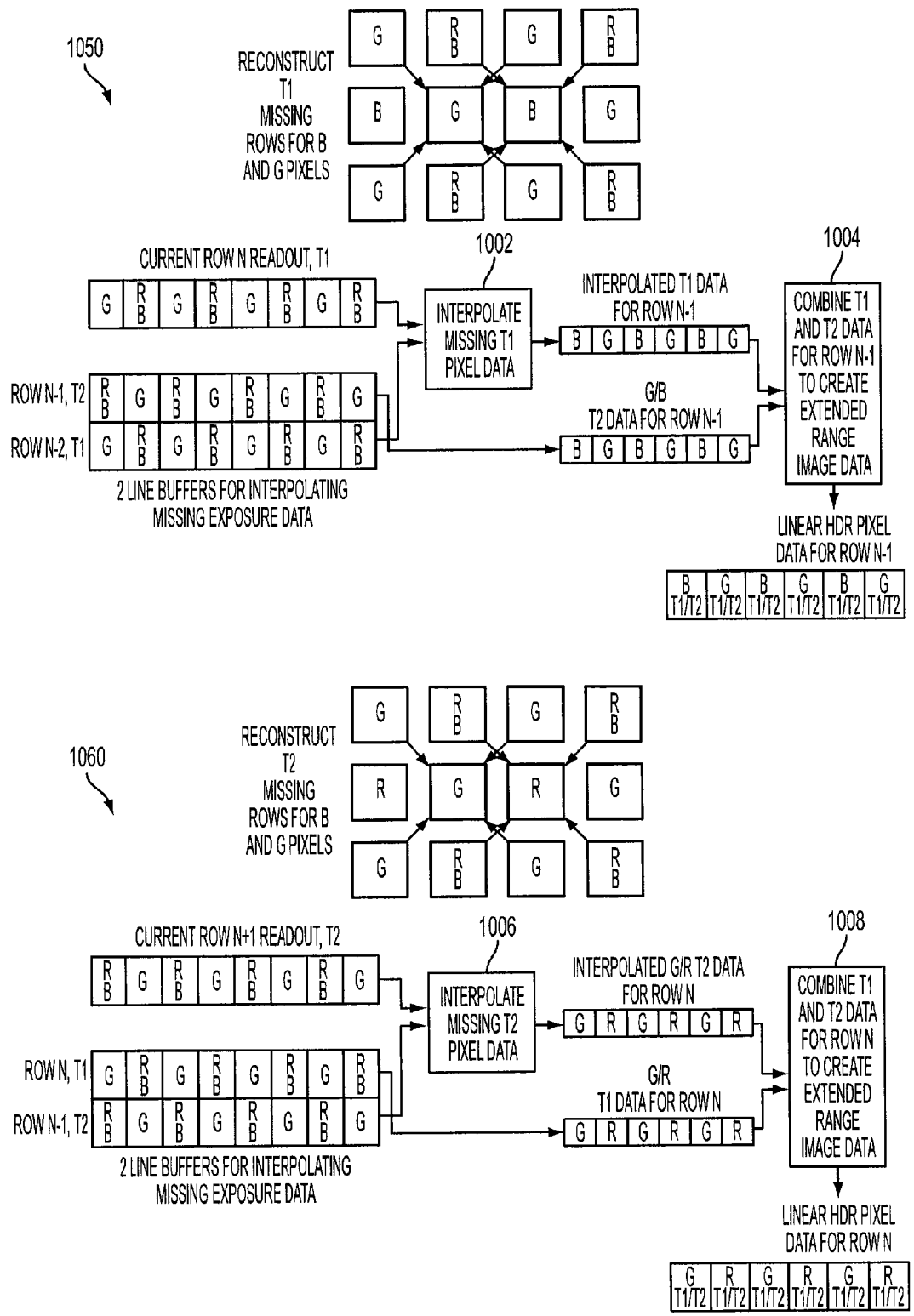
FIG. 10 is a detailed view of the interlaced readout for the imager implementing the row based dual exposure, according to an embodiment of the present invention.

Shown in FIG. 10 is an interpolation process that may be used by the imager. In FIG. 10, field F1 is generated based on diagram 1050 while field F2 is generated based on diagram 1060. In 1050 and 1060, row buffer memories are used to store values of the previous two rows. Row buffering allows interpolation for each exposure field. When the current row N is a T1 row, the interpolation for missing pixels for T1 on row N−1 is performed. The interpolated T1 data and the known T2 data for row N−1 are then combined to form an extended range pixel data row. Similarly, when the current row N+1 is a T2 row, the interpolation for pixels for T2 on row N is performed. The known T1 data and the interpolated T2 data for row N are then combined to form extended range pixel data row. This interpolation and combination process alternates between T1 and T2 as the sensor reads out the pixel rows during interlaced readout until the full HDR image is produced.

Figure 11:
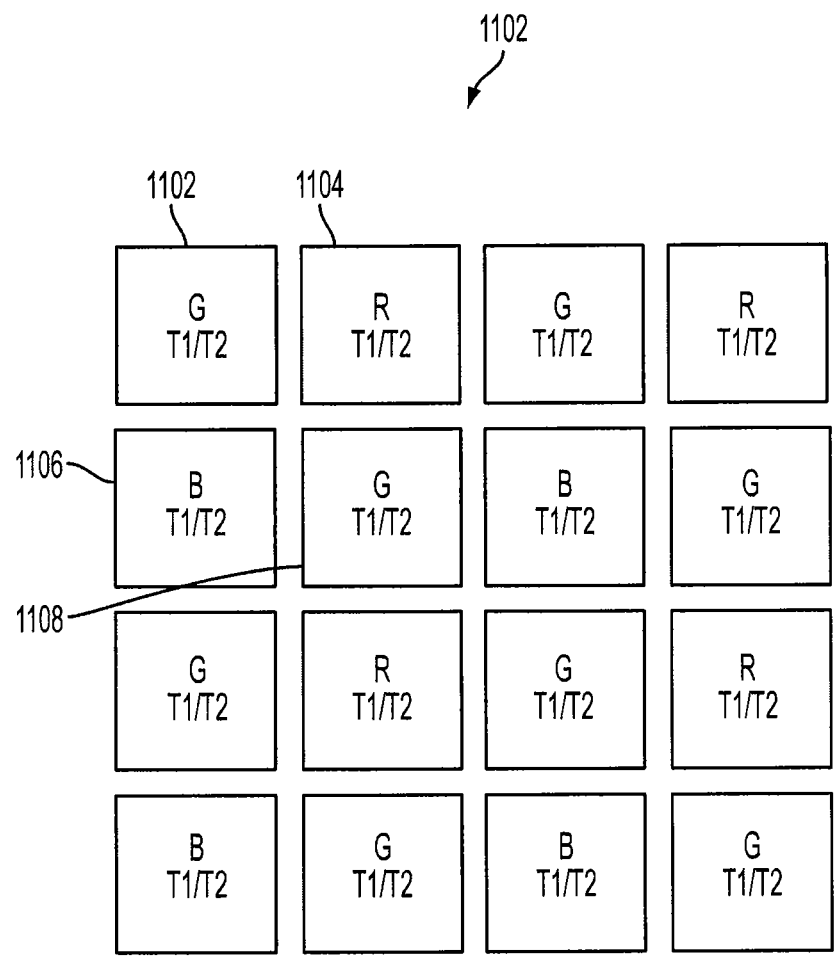
FIG. 11 is a view of an image constructed based on the row based dual exposure and readout process shown in FIG. 10, according to an embodiment of the present invention.
Figure 12:
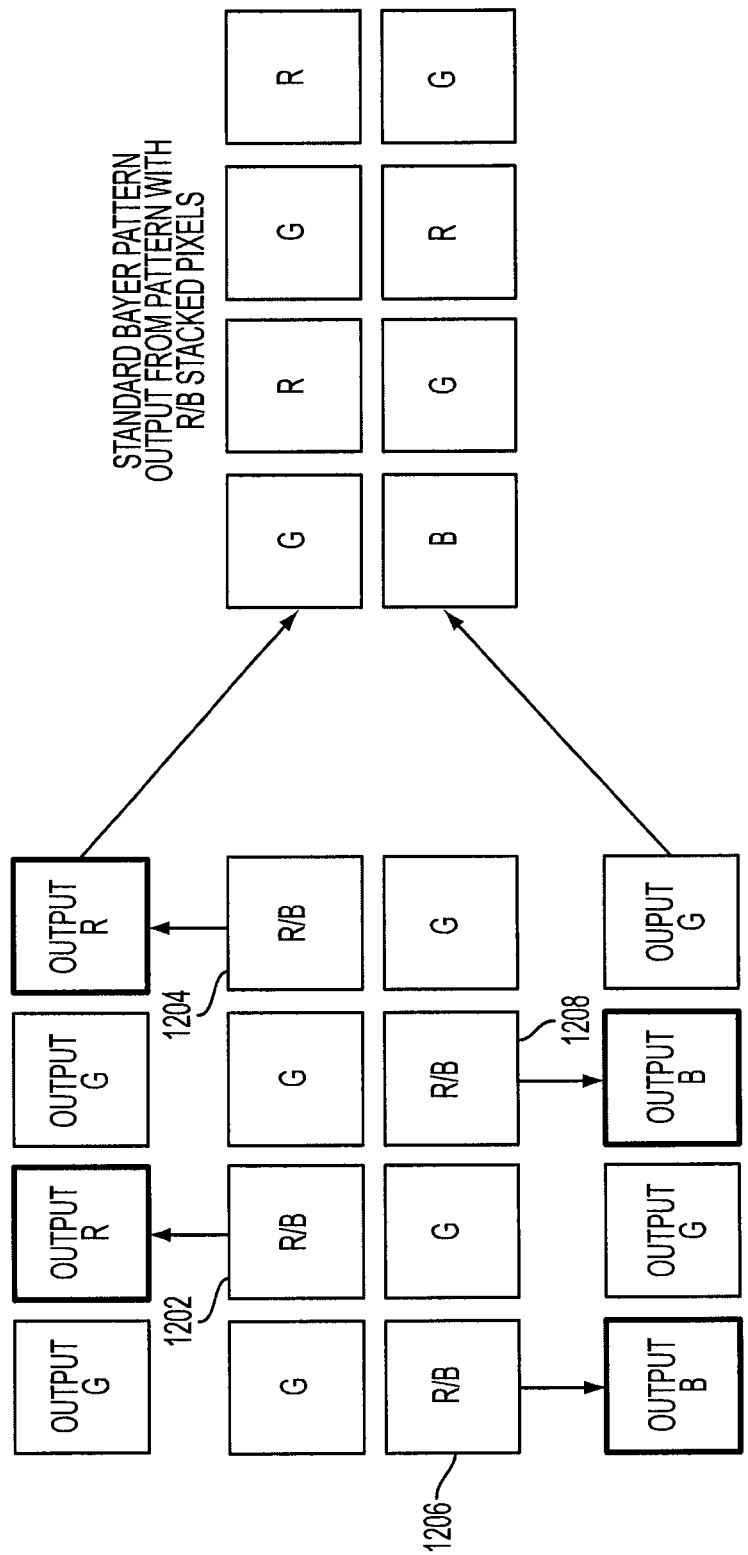
FIG. 12 is a view of a stacked CFA imager operating in a single exposure non-interlaced mode, according to an embodiment of the present invention.

Thus, as shown in FIG. 11, the final combined image 1102 may include the full Bayer pattern pixels that have information from both exposures (information from both the long and short exposures result in a combined high dynamic range image). For example, pixels 1102, 1104, 1106 and 1108 along with the rest of the pixels in the array include information from both long exposure T1 and short exposure T2 (i.e., dark image data and bright image data).

It should be noted, however, that the stacked Bayer pattern CFA of the present invention may be utilized in non-interlaced mode where all pixels have the same exposure time. For example, the stacked R/B pattern may be effectively used in a conventional Bayer pattern mode for compatibility with systems that do not support interlaced Bayer processing algorithms. Since the stacked R/B pattern includes R and B information, the imager can select either the R or the B value to complete the conventional Bayer pattern CFA.

In some systems it may also be desirable to set the exposure time to be the same for all pixels in the array, and to read out all of the pixel information from the G and R/B pixels to provide improved resolution. The conventional Bayer pattern has four pixel outputs in a 2×2 kernel, whereas the proposed pattern has six pixel outputs in the same 2×2 kernel. The additional R and B pixel outputs effectively increase the resolving power of the system for the red and blue channels and may be used in a demosaic interpolation algorithm to improve the camera system resolution.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An imager, comprising:
    a pixel array including a plurality of pixels arranged in rows and columns;
    a color filter array (CFA) including a color pattern of a first color filter allowing a first pixel to detect a first color of light, and a second color filter allowing a second pixel to detect a second color of light and a third color of light, wherein each of the color filters in the color pattern are included in each row of the pixel array; and
    a controller configured to generate an extended dynamic range image by combining short exposure data from pixels in a first row of the pixel array, interpolated data based on the short exposure data from the pixels in the first row of the pixel array, long exposure data from pixels in an adjacent second row of the pixel array, and interpolated data based on the long exposure data from the pixels in the adjacent second row of the pixel array.

2. The imager of claim 1, wherein the first color is green, the second color is red and the third color is blue.

3. The imager of claim 1, wherein the first color filter also detects a fourth color of light, and the first color is green, the second color is red, the third color is blue, and the fourth color is cyan.

4. The imager of claim 1, wherein the first pixel has a single photo-sensor for detecting green light, and the second pixel is a stacked pixel that has two photo-sensors for detecting red and blue light respectively.

5. An imager for improving image quality comprising:
    a pixel array including a plurality of pixels arranged in rows and columns;
    a color filter array (CFA) including a first color filter allowing a first pixel to detect a first color of light, and a second color filter allowing a second pixel to detect a second color of light and a third color of light;
    a controller configured to:
      a) expose pixels in odd rows of the pixel array for a first time period,
      b) expose pixels in even rows of the pixel array for a second time period which is longer than the first time period,
      c) generate an odd image by reading pixel values in odd rows of the pixel array, and interpolating pixel values between the odd rows based on the first color and the second color,
      d) generate an even image by reading pixel values in the even rows of the pixel array, and interpolating pixel values between the even rows based on the first color and the third color,
      e) generating a combined image by combining the odd image and the even image.

6. The imager of claim 5, wherein each row in the pixel array has a plurality of first pixels and a plurality of second pixels, and wherein the first pixel has a single photo-sensor for detecting green light, and the second pixel is a stacked pixel that has two photo-sensors for detecting red and blue light respectively.

7. The imager of claim 5, wherein pixels in the odd rows and pixels in the even rows are configured to alternate between the first pixel and second pixel so that adjacent rows have different colors in common columns.

8. The imager of claim 5, wherein the pixel values in the odd rows are exposed to light for an exposure time period T1 to generate a first interlaced field F1.

9. The imager of claim 5, wherein the pixel values in the even rows are exposed to light for an exposure time period T2 to generate a second interlaced field F2.

10. The imager of claim 5, wherein the controller is configured to start the first time period before the second time period, and end both the first time period and second time period simultaneously.

11. The imager of claim 5, wherein the controller is configured to set the first time period based on bright image data being captured, and set the second time period based on dark image data being captured.

12. The imager of claim 5, wherein the controller is configured to interpolate the skipped even rows by selecting the second color or the third color values from the adjacent odd rows based on the color pattern in the skipped even rows.

13. The imager of claim 5, wherein the controller is configured to interpolate the skipped odd rows by selecting the second color or the third color values from the adjacent even rows based on the color pattern in the skipped odd rows.

14. The imager of claim 5, wherein the controller is configured to combine the interpolated pixel values in the odd image with spatially corresponding pixel values in the even image.

15. The imager of claim 5, wherein the controller is configured to combine the interpolated pixel values in the even image with spatially corresponding pixel values in the odd image.

16. The imager of claim 5, wherein the controller is configured to generate the combined image by combining spatially corresponding pixel values from the odd image and even image as a weighted average.

17. An imager, comprising:
    a pixel array including a plurality of pixels arranged in rows and columns;
    a color filter array including a first color filter allowing a first pixel to detect a first color of light, and a second color filter allowing a second pixel to detect a second color of light and a third color of light;
    a controller configured to:
      generate a short exposure image by reading pixel values in odd rows of the pixel array and interpolating pixel values between the odd rows based on the first color and the second color,
      generate a long exposure image by reading pixel values in the even rows of the pixel array and interpolating pixel values between the even rows based on the first color and the third color, and
      generate a high dynamic range image by combining the short exposure image and the long exposure image.

18. The imager defined in claim 17 wherein the controller is further configured to integrate charges using the pixels in the odd rows of the pixel array for a first time period and integrate charges using the pixels in the even rows of the pixel array for a second time period which is longer than the first time period.

19. The imager defined in claim 17 wherein the controller is configured to combine the short exposure image and the long exposure image by selecting bright image data from the short exposure image and selecting dark image data from the long exposure image.

20. The imager defined in claim 19 wherein the high dynamic range image includes the selected bright image data and the selected dark image data.

* * * * *